(12) United States Patent
Sahbari

(10) Patent No.: US 6,475,966 B1
(45) Date of Patent: Nov. 5, 2002

(54) PLASMA ETCHING RESIDUE REMOVAL

(75) Inventor: Javad J. Sahbari, Sunnyvale, CA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 09/514,063

(22) Filed: Feb. 25, 2000

(51) Int. Cl.[7] .............................. C11D 3/44; G03F 7/42
(52) U.S. Cl. .................. 510/175; 510/176; 510/177; 510/178; 430/256; 438/694; 438/745
(58) Field of Search .......................... 430/7, 256, 260, 430/281, 329, 318, 313, 331; 134/2, 38, 40; 510/175, 176, 177, 178; 360/122, 126; 252/548; 438/745, 694

(56) References Cited

U.S. PATENT DOCUMENTS

| | | | |
|---|---|---|---|
| 4,401,747 A | 8/1983 | Ward, Jr. et al. | |
| 5,334,332 A | 8/1994 | Lee | |
| 5,407,788 A | * 4/1995 | Fang | ............ 430/318 |
| 5,795,702 A | 8/1998 | Tanabe et al. | |

FOREIGN PATENT DOCUMENTS

WO   WO 98/10050   3/1998

* cited by examiner

Primary Examiner—Gregory E. Webb
(74) Attorney, Agent, or Firm—S. Matthew Cairns

(57) ABSTRACT

Disclosed are compositions useful for the removal of plasma etching polymeric residue from substrates, such as electronic devices. Also disclosed are methods of removing such plasma etching polymeric residue.

5 Claims, No Drawings

PLASMA ETCHING RESIDUE REMOVAL

BACKGROUND OF THE INVENTION

The present invention relates generally to the field of removal of polymeric materials from a substrate. In particular, the present invention relates to compositions and methods for the removal of plasma treated polymeric material from electronic devices.

Numerous materials containing polymers are used in the manufacture of electronic devices, such as circuits, disk drives, storage media devices and the like. Such polymeric materials are found in photoresists, solder masks, antireflective coatings, and the like. During manufacture of such electronic devices, the polymeric material is subjected to conditions that make the removal of such polymeric material difficult.

For example, modern technology utilizes positive-type resist materials for lithographically delineating patterns onto a substrate so that the patterns can be subsequently etched or otherwise defined into the substrate material. The resist material is deposited as a film and the desired pattern is defined by exposing the resist film to energetic radiation. Thereafter the exposed regions are subject to a dissolution by a suitable developer liquid. After the pattern has been thus defined in the substrate the resist material must be completely removed from the substrate to avoid adversely affecting or hindering subsequent operations or processing steps.

It is necessary in such a photolithographic process that the photoresist material, following pattern delineation, be evenly and completely removed from all unexposed areas so as to permit further lithographic operations. Even the partial remains of a resist in an area to be further patterned is undesirable. Also, undesired resist residues between patterned lines can have deleterious effects on subsequent processes, such as metallization, or cause undesirable surface states and charges.

Known photoresist removal or stripping formulations are typically contain strong alkaline solutions, organic polar solvents or strong acids and oxidizing agents. Typical organic polar solvents include pyrolidones such N-methyl pyrrolidone, N-ethyl pyrrolidone, N-hydroxyethyl pyrrolidone and N-cyclohexyl pyrrolidone; amides including dimethylacetamide or dimethylformamided; phenols and derivatives thereof. Such solvents have been used in combination with amines or other alkaline material. For example, U.S. Pat. No. 5,334,332 (Lee) discloses a composition for removing etching residue containing 5 to 50% hydroxylamine, 10 to 80% of at least one alkanolamine, and water. U.S. Pat. No. 4,401,747 (Ward et al.) discloses a stripping composition containing 30 to 90% 2-pyrrolidinone and 10 to 70% dialkyl sulfone.

Within the last 5 years, technology for storage media has grown exponentially and has driven magnetoresistive read-write device performance through miniaturization and higher area density which today exceeds 20 Gb/in$^2$. In order to keep pace with next generation technology, read-write head manufacturers are utilizing advanced photoresists and multi component ion etch recipes to achieve desired thin film stack patterns. To successfully integrate multiple film stacks into sub-micron features with the correct magnetic and signal sensitivity, each layer within such devices must be clean from polymer, ionic and other forms of organic/inorganic contamination or residue. Such undesired residue will adversely affect the performance and reliability of the device.

Plasma etching, reactive ion etching and ion milling are required as the geometry of features get smaller and pattern density increases. During the plasma etch process a photoresist film forms a hard to remove organometallic polymeric residue on the sidewalls of the various features being etched. Furthermore, the photoresist is extensively cross-linked due to the high vacuum and high temperature conditions in the etch chamber. Known cleaning processes do not acceptably remove such polymeric residue. For example, acetone or N-methyl pyrrolidinone is currently used at extreme conditions, which include high temperature and extended cycle times. Such use conditions are often above the flashpoint of the solvent which raises certain environmental, health and safety issues regarding operator exposure. In addition, productivity and throughput are adversely affected by the extended process cycle times required. Even with such extreme stripping conditions, the devices need manual "swabbing", or brushing, to remove tenacious "rabbit ear"-type polymeric residue from the fine features.

For example, WO 98/10050 (Honda et al.) discloses compositions for the removal of plasma etching residues including a water, at least one hydroxylammonium compound and at least one basic compound selected from amines and quaternary ammonium hydroxides and having a pH of 2 to 6.

In addition, known stripping compositions have numerous other drawbacks including, undesirable flammability, toxicity, volatility, odor, necessity for use at elevated temperatures such as up to 100° C., and high cost due to handling regulated materials.

There is thus a continuing need for strippers that effectively remove plasma etching polymeric residue, are more environmentally compatible, and do not cause corrosion of the substrate.

SUMMARY OF THE INVENTION

It has been surprisingly found that plasma etching polymeric residue may be easily and cleanly removed from substrates using an alkaline system. Such plasma etching polymeric residue may be effectively removed according to the present invention without corrosion of underlying metal layers.

In one aspect, the present invention provides a composition for the removal of plasma etching polymeric residue from a substrate including one or more polar aprotic solvents, one or more first polymer dissolution enhancing bases selected from tetra($C_1$–$C_6$)alkylammonium hydroxide, tetra($C_1$–$C_6$)alkylammonium carbonate, tetra ($C_1$–$C_6$)alkylammonium acetate, tetra($C_1$–$C_6$) alkylammonium citrate or choline hydroxide, one or more second polymer dissolution enhancing bases selected from hydroxylamine, hydroxylamine formate or hydroxylamine buffered with carboxylic acid.

In a second aspect, the present invention provides a method of removing plasma etching polymeric residue from a substrate including the step of contacting a substrate containing plasma etching polymeric residue to be removed with the composition described above.

DETAILED DESCRIPTION OF THE INVENTION

As used throughout this specification, the following abbreviations shall have the following meanings unless the context clearly indicates otherwise: DMSO=dimethyl sulfoxide; TMAH=tetramethylammonium hydroxide;

DI=deionized; %wt=percent by weight; g=gram; °C.=degrees Centigrade; and min=minute. All percents are by weight. All numerical ranges are inclusive.

The terms "stripping" and "removing" are used interchangeably throughout this specification. Likewise, the terms "stripper" and "remover" are used interchangeably. "Alkyl" refers to linear, branched and cyclic alkyl. As used throughout this specification, the term "aprotic" refers to compounds that do not accept or yield a proton. The term "side wall polymer" refers to the organometallic polymeric residue remaining after plasma etching.

The compositions of the present invention include one or more polar aprotic solvents, one or more first polymer dissolution enhancing bases selected from tetra($C_1$–$C_6$) alkylammonium hydroxide, tetra($C_1$–$C_6$)alkylammonium carbonate, tetra($C_1$–$C_6$)alkylammonium acetate, tetra ($C_1$–$C_6$)alkylammonium citrate or choline hydroxide, one or more second polymer dissolution enhancing bases selected from hydroxylamine, hydroxylamine formate or hydroxylamine buffered with carboxylic acid, and optionally one or more organic additives.

The polar aprotic solvents suitable for use in the present invention include, but are not limited to, dimethyl sulfoxide, sulfolane, dimethyl sulfurdioxide, and the like. It is preferred that the polar aprotic solvent is dimethyl sulfoxide or sulfolane. Typically, the amount of polar aprotic solvent is in the range of about 20 to about 99%wt, preferably from about 40 to about 98 %wt, and more preferably from about 60 to about 95%wt, based on the total weight of the composition. Such polar aprotic solvents are generally commercially available from a variety of sources, such as Aldrich Chemical Company (Milwaukee, Wis.), and may be used without further purification.

Suitable first polymer dissolution enhancing bases are any selected from tetra($C_1$–$C_6$)alkylammonium hydroxide such as tetramethylammonium hydroxide and tetrabutylammonium hydroxide; tetra($C_1$–$C_6$)alkylammonium carbonate such as tetramethylammonium carbonate; tetra($C_1$–$C_6$) alkylammonium acetate such as tetramethylammonium acetate; tetra($C_1$–$C_6$)alkylammonium citrate such as tetramethylammonium citrate; tetra($C_1$–$C_6$)alkylammonium silicate such as tetramethylammonium silicate; or choline hydroxide. The tetra($C_1$–$C_4$)alkylammonium compounds of the present invention include substituted tetraalkylammonium compounds, such as tetra(hydroxyalkyl)ammonium compounds. Thus, for example, tetra($C_1$–$C_4$) alkylammonium hydroxide includes hydroxy($C_1$–$C_4$)alkyl tri($C_1$–$C_4$)alkylammonium hydroxide such as 2-hydroxyethyl trimethylammonium hydroxide, di(hydroxy ($C_1$–$C_4$)alkyl) di($C_1$–$C_4$)alkylammonium hydroxide, tri (hydroxy($C_1$–$C_4$)alkyl) ($C_1$–$C_4$)alkylammonium hydroxide and tetra(hydroxy($C_1$–$C_4$)alkyl)ammonium hydroxide. It is preferred that the first polymer dissolution enhancing base is selected from one or more of tetramethylammonium hydroxide, tetramethylammonium carbonate, tetramethylammonium acetate or tetramethylammonium citrate. Tetramethylammonium hydroxide is typically used as the pentahydrate. It is preferred that the first polymer dissolution enhancing bases are free of metal ions, particularly sodium, potassium and the like. Such first polymer dissolution enhancing bases are generally commercially available, such as from Aldrich (Milwaukee, Wis.) and may be used without further purification.

Typically, the one or more first polymer dissolution enhancing bases are present in an amount of from about 0.1 to about 10%wt, based on the total weight of the composition. It is preferred that the first polymer dissolution enhancing bases are present in an amount of from about 1 to about 5%wt, and more preferably from about 2 to about 4%wt. When more than one first polymer dissolution enhancing bases is used in the present invention, such bases may be combined in any ratio.

Suitable one or more second polymer dissolution enhancing bases are selected from hydroxylamine, hydroxylamine formate or hydroxylamine buffered with carboxylic acid. Such one or more second polymer dissolution enhancing bases are generally commercially available, such as from Aldrich (Milwaukee, Wis.) and may be used without further purification. Hydroxylamine is normally available as a 50%wt solution in water and may be used in the present invention as is.

Typically, the one or more second polymer dissolution enhancing bases are present in an amount of from about 0.1 to about 30%wt, and preferably from about 10 to about 15%wt, based on the total weight of the composition. When more than one second polymer dissolution enhancing bases is used in the present invention, such bases may be combined in any ratio.

A particularly useful composition of the present invention includes 90%wt dimethyl sulfoxide, 8–9%wt hydroxylamine formate and 1–2%wt tetramethylammonium hydroxide petahydrate.

The compositions useful in the present invention may optionally include one or more organic additives. Suitable optional additives include, but are not limited to, cosolvents, corrosion inhibitors, surfactants, chelating agents and the like.

Suitable cosolvents include, but are not limited to, ($C_1$–$C_{20}$)alkanediols such as ethylene glycol, diethylene glycol, propylene glycol, 2-methylpropanediol and dipropylene glycol; ($C_1$–$C_{20}$)alkanediol ($C_1$–$C_6$)alkyl ethers such as propylene glycol monomethyl ether, propylene glycol dimethyl ether, propylene glycol n-butyl ether, dipropylene glycol monomethyl ether, dipropylene glycol dimethyl ether, dipropyleneglycol n-butyl ether, tripropylene glycol monomethyl ether and propylene glycol methyl ether acetate; aminoalcohols such as aminoethylaminoethanol; N-($C_1$–$C_{10}$)alkylpyrrolidones such as N-methylpyrrolidone, N-ethylpyrrolidone, N-hydroxyethylpyrrolidone and N-cyclohexylpyrrolidone; and the like. It is preferred that the cosolvent is one or more of ($C_1$–$C_{20}$)alkanediols, ($C_1$–$C_{20}$)alkanediol ($C_1$–$C_6$)alkyl ethers and aminoalcohols, and more preferably one or more of propylene glycol monomethyl ether, propyleneglycol dimethyl ether, propylene glycol n-butyl ether, dipropylene glycol monomethyl ether, dipropylene glycol dimethyl ether, dipropyleneglycol n-butyl ether, tripropylene glycol monomethyl ether, propylene glycol methyl ether acetate and aminoethylaminoethanol.

When such cosolvents are used they are typically present in an amount in the range of about 5 to about 80%wt, based on the total weight of the composition, and preferably about 10 to about 45%wt. It is preferred that one or more cosolvents are used in the present invention. It is preferred that the weight ratio of polar aprotic solvent to cosolvent is in the range of 50:50 to 95:5, preferably 60:40 to 80:20, and more preferably at a ratio of 75:25.

Suitable corrosion inhibitors useful in the present invention include, but are not limited to, catechol; ($C_1$–$C_6$) alkylcatechol such as methylcatechol, ethylcatechol and tert-butylcatechol; benzotriazole; ($C_1$–$C_{10}$) alkylbenzotriazoles; ($C_1$–$C_{10}$)hydroxyalkylbenzotriazoles;

2-mercaptobenimidazole; gallic acid; gallic acid esters such as methyl gallate and propyl gallate; and the like. It is preferred that the corrosion inhibitor is catechol, ($C_1$–$C_6$) alkylcatechol, benzotriazole or ($C_1$–$C_{10}$) alkylbenzotriazoles.

When such corrosion inhibitors are used they are typically present in an amount in the range of from about 0.01 to about 10%wt, based on the total weight of the composition. It is preferred that the amount of corrosion inhibitor is from about 0.2 to about 5%wt, more preferably about 0.5 to about 3%wt, and most preferably from about 1.5 to about 2.5%wt. It is preferred that at least one corrosion inhibitor be used in the compositions of the present invention.

Nonionic and cationic surfactants may be used with the stripping compositions of the present invention. Nonionic surfactants are preferred. Such surfactants are generally commercially available. The surfactants are typically present in an amount of from about 0.2 to about 5%wt, preferably from about 0.5 to about 3%wt, and more preferably from about 1 to about 2.5%wt, based on the total weight of the composition.

The compositions may be prepared by combining the one or more polar aprotic solvents and the one or more first and second polymer dissolution enhancing bases in any order. When a cosolvent is used, it is preferred that the polar aprotic solvent and cosolvent are blended first, followed by the one or more first and second polymer dissolution enhancing bases and then by any other optional additives.

The compositions of the present invention are suitable for removing plasma etching polymeric residue from a substrate, such as a dry plasma etched flat panel display plate or silicon wafer. Suitable plasma etching polymeric residue that can be removed by the present invention is any plasma etching residue from photoresists, soldermasks, antireflective coatings, and the like. The compositions of the present invention are also particularly useful in removing the polymeric residue present after reactive ion etching and ion milling of materials.

An advantage of the process of the present invention is that lower temperatures may be used than those used with known stripping compositions. Typically, the plasma etching polymeric residue removal process of the present invention may be carried out at any temperature, such as from room temperature to about 120° C., preferably from about 35° to about 85° C., more preferably from about 50° C. to about 85° C., and most preferably from about 70° to about 85° C. It is preferred that the plasma etching polymeric residue compositions of the present invention be heated. It will be appreciated by those skilled in the art that the polymer removal compositions of the present invention may be heated by a variety of means.

Plasma etching polymeric residue on a substrate may be removed by contacting the substrate with a composition of the present invention. The substrate may be contacted with the compositions of the present invention by any known means, such as by placing the substrate in a vessel containing a composition of the present invention or by spraying a composition of the present invention on the substrate. When the substrate is placed in a vessel, it is preferred that the level of the compositions of the present invention in the vessel be sufficient to completely immerse the plasma etching polymeric residue on the substrate. After the substrate has been contacted with the compositions of the present invention for a period of time sufficient to remove the plasma etching residue, the substrate is removed from contact with the compositions of the present invention and rinsed with DI water.

An advantage of the compositions of the present invention is they are highly effective in removing post plasma etch residues, i.e. side wall polymer, when other conventional strippers are not capable of removing such residues. The compositions of the present invention also quickly remove side wall polymer without having an adverse effect, i.e. corrosion, on metal substrate.

The following examples are intended to illustrate further various aspects of the present invention, but are not intended to limit the scope of the invention in any aspect.

EXAMPLE

This example illustrates the manufacture of a flat panel display ("FPD" or "TFT/LCD").

Liquid crystal display flat display panels having as metal stacks copper ("Cu"), molybdenum ("Mo"), tungstem ("W") and titanium-nitride ("Ti—N") and containing a positive photoresist layer were treated with high density plasma, either $Cl_2$, $CCl_4$, $CHCl_3$ or $CF_4$, to etch metal layers and were ashed by oxygen plasma. The resulting plasma etched polymer residue was tested using three commercially available photoresist strippers and polymer removers (Comparatives A–C) and two compositions of the present invention. The compositions tested are reported in Table 1. All percentages are percent by weight.

TABLE 1

| Sample | Composition |
| --- | --- |
| A (Comparative) | 30% hydroxylamine/65% diglycolamine/5% catechol |
| B (Comparative) | 30% hydroxylamine/65% monoethanolamine/5% catechol |
| C (Comparative) | 70% DMSO/25% aminoethylaminoethanol/5% t-butylcatechol |
| 1 (Invention) | 2.5% TMAH/17.5% hydroxylamine/75% DMSO/5% t-butylcatechol |
| 2 (Invention) | 2.5% TMAH/15% hydroxylamine/77.5% DMSO/5% benzotriazole |

The stripping times and temperatures used were the manufacturers' recommended times and temperatures and are reported in the table below. The samples were evaluated for the extent of polymer residue removal capability of each composition was examined by a JEOL-6320 SEM (Scanning Electron Microscope) photos as well as measurement of resistivity/conductivity of contact via openings. The samples were also evaluated for any corrosion of the metal layers. The amount of corrosion of each metal substrate were measured using the concentration of ionic species in the stripping solutions before and after stripping process. The ionic concentrations were measured by a HP-4500 inductively coupled plasma emission mass spectrometer ("ICP/MS") using cold plasma techniques and utilizing standard addition methods. The extent of metal corrosion and polymer residue removal results are reported in Table 2.

TABLE 2

| Sample | Temperature (° C.) | Time (min) | Residue Removal (%) | Corrosion |
|---|---|---|---|---|
| A | 75 | 60 | 70–80 | Cu, Mo, Ti—N, W |
| B | 75 | 60 | 70–80 | Cu, Mo, Ti—N, W |
| C | 90 | 90 | 60 | Cu, W, Mo, Ti—N |
| 1 | 85 | 15 | 100 | None |
| 2 | 75 | 15 | 100 | None |

The above data clearly show that the compositions of the invention are very effective at quickly and completely removing plasma etching polymeric residue without causing corrosion of the substrate.

What is claimed is:

1. A composition for the removal of plasma etching polymeric residue from a substrate comprising: 75 to 77.5% dimethyl sulfoxide; 2.5% tetramethylammonium hydroxide; 15 to 17.5% hydroxylamine; and 5% of a corrosion inhibitor selected from the group consisting of t-butylcatechol and benzotriazole.

2. The composition of claim 1 further comprising one or more organic additives selected from the group consisting of cosolvents, surfactants and chelating agents.

3. The composition of claim 2 wherein the cosolvent is selected from ($C_1$–$C_{20}$)alkanediols, ($C_1$–$C_{20}$)alkanediol ($C_1$–$C_6$)alkyl ethers, aminoalcohols, or N-($C_1$–$C_{10}$) alkylpyrrolidones.

4. The composition of claim 3 wherein the cosolvent is selected from ethylene glycol, diethylene glycol, propylene glycol, 2-methylpropanediol, dipropylene glycol, propylene glycol monomethyl ether, propylene glycol dimethyl ether, propylene glycol n-butyl ether, dipropylene glycol monomethyl ether, dipropylene glycol dimethyl ether, dipropyleneglycol n-butyl ether, tripropylene glycol monomethyl ether, propylene glycol methyl ether acetate aminoethylaminoethanol, N-methylpyrrolidone, N-ethylpyrrolidone, N-hydroxyethylpyrrolidone or N-cyclohexylpyrrolidone.

5. A method of removing plasma etching polymeric residue from a substrate including the step of contacting a substrate containing plasma etching polymeric residue to be removed with the composition of claim 1.

* * * * *